(12) United States Patent
Hartlove et al.

(10) Patent No.: US 7,414,661 B2
(45) Date of Patent: Aug. 19, 2008

(54) CMOS IMAGE SENSOR USING GRADIENT INDEX CHIP SCALE LENSES

(75) Inventors: Jason T. Hartlove, Los Altos, CA (US); David S. Pitou, San Jose, CA (US); Patricia E. Johnson, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 735 days.

(21) Appl. No.: 10/260,186

(22) Filed: Sep. 27, 2002

(65) Prior Publication Data

US 2004/0032523 A1 Feb. 19, 2004

Related U.S. Application Data

(60) Provisional application No. 60/403,411, filed on Aug. 13, 2002.

(51) Int. Cl.
*H04N 5/225* (2006.01)
*H04N 3/14* (2006.01)
*H04N 5/335* (2006.01)
*H04N 9/04* (2006.01)
*H04N 9/083* (2006.01)

(52) U.S. Cl. ............... 348/340; 348/276; 438/64

(58) Field of Classification Search ............ 348/276, 348/294, 340, 376; 257/436; 438/64, 69, 438/436, 452, 457; 359/452, 237
See application file for complete search history.

(56) References Cited

U.S. PATENT DOCUMENTS

| 6,251,700 B1 * | 6/2001 | Lin et al. ............... 438/70 |
| 6,285,064 B1 * | 9/2001 | Foster ............... 257/433 |
| 6,744,109 B2 * | 6/2004 | Barton et al. ............... 257/436 |
| 2004/0012698 A1 | 1/2004 | Suda et al. |

FOREIGN PATENT DOCUMENTS

| EP | 1239519 A | 9/2002 |
| JP | 2000031445 A | 1/2000 |
| JP | 2000323692 A | 11/2000 |
| JP | 2001351997 A | 12/2001 |

OTHER PUBLICATIONS

European Search Report for European Patent App. No. 03007806.7-2203 dated Nov. 25, 2005.

* cited by examiner

*Primary Examiner*—James M. Hannett
*Assistant Examiner*—Kelly L Jerabek
(74) *Attorney, Agent, or Firm*—RatnerPrestia

(57) ABSTRACT

A camera module includes a gradient index lens on a spacer plate attached over an array of pixel sensors and associated micro lenses. The spacer plate and gradient index lens can be formed at the wafer level during the manufacture of multiple camera modules. A process for manufacturing the camera modules thus provides tolerances and yields provided by wafer processing techniques rather than mechanical assembly.

11 Claims, 2 Drawing Sheets

CMOS IMAGE SENSOR USING GRADIENT INDEX CHIP SCALE LENSES

This patent document claims the benefit of the earlier filing date of U.S. provisional patent application No. 60/403,411, filed Aug. 13, 2002, which is hereby incorporated by reference in its entirety.

BACKGROUND

The small size and low cost of CMOS image sensors are increasingly leading to their use instead of CCDs in imaging applications. These advantages of CMOS image sensors may further make imaging practical in several new applications such as in portable communication and computing systems. In particular, as wireless networks expand their ability to carry more data in shorter times, imaging systems may become standard on portable telephones and PDAs to permit users to capture images and transmit the images to remote storage. Such integration of imaging systems requires the image sensors to be low cost, small, and compatible with the manufacturing process of the telephones or other systems containing the image sensors.

Current camera modules containing CMOS image sensors generally include a semiconductor die with microelectronic packaging including a traditional plastic or glass lens that forms an image on the CMOS image sensors on the die. These camera modules make the addition of a complete electronic imaging system a simple operation during manufacture of a telephone or PDA. No lens focusing or other precision optical assembly or testing is required during manufacture of the telephone or PDA because the camera modules come with lenses properly aligned and focused.

The manufacturing of camera modules presents several challenges. In particular, the manufacturing of each module requires several mechanical assembly process steps for centering and aligning one or more far-field lenses. The combined or total tolerances of the mechanical assembly process steps can exceed the allowable maximums that reasonable optical designs dictate. Additionally, the cost of the assembly and particularly the yield loss associated with the mechanical tolerances and contamination during assembly can be high.

Another concern for current camera modules is that the lenses and packaging materials are not compatible with the high solder reflow temperatures associated with lead-free assembly. Accordingly, to satisfy manufacturers' and consumers' desire for lead-free manufacturing and devices, an additional structure such as a flexible circuit or a lead tape is required to keep the module away from the high temperature reflow. Such structures increase the size and cost of camera modules.

Structures and methods are sought for decreasing the manufacturing cost of camera modules containing CMOS imaging sensors and for making camera modules more compact and more compatible with assembly techniques such as high temperature solder reflow processes.

SUMMARY

In accordance with an aspect of the invention, a process for manufacturing camera modules forms and integrates chip-scale lenses during wafer processing. To permit wafer-level fabrication of the lenses, multiple gradient index lenses are fabricated on a spacer plate that overlies multiple pixel sensor arrays and provides spacing between the gradient index lens and an array of pixel sensors formed in the chip. The spacer plate generally provides a protective cover and optionally rests on standoffs when air gaps are required over the sensor arrays. The spacer plate can additionally include active optical coatings such as an infrared (IR) filter or a color filter, and metallization on the spacer plate or the gradient index lens can provide an aperture or stop for the camera module.

The fabrication process can be performed in standard wafer processing facilities, thereby making the attachment and alignment of the far-field lens part of the in-line semiconductor manufacturing cycle. This greatly reduces manufacturing costs and complexity. Additionally, wafer-processing facilities generally provide an environment that is cleaner than the environment conventionally used for assembling camera modules. The yield of working camera modules thus increases as a result of reducing the sources and probability of contamination. Wafer processing techniques such as wafer alignment and photolithography processes align the far-field lenses to the respective CMOS sensor arrays and provide tolerances that are better than traditional mechanical packaging tolerances. The optical performance of the camera modules can thus be improved.

The camera modules manufactured using processes in accordance with the invention have several performance advantages. In particular, a reduction in the number of air-to-glass interfaces in a camera module improves light transmission efficiency, which results in lower light losses and provides the camera module with better low light level performance. Additionally, avoiding mechanical lens assembly allows the camera module to have a smaller form factor and provides better environmental stability against contamination, thermal, and mechanical stresses. The camera module is also compatible with high temperature IR coating processes and lead-free solder reflow assembly on a printed board.

One specific embodiment of the invention is a camera module that includes an array of pixel sensors formed in and on a substrate, a spacer plate overlying the array of pixel sensors, and a gradient index lens overlying the spacer plate. The spacer plate can include an optically active coating such as an IR filter, a color filter, or an antireflective coating. The gradient index lens, which can reside on the spacer plate, is a chip scale lens that forms an image extending across the array of pixel sensors. An opaque patterned layer on the gradient index lens or on the spacer plate can define an aperture for the camera module.

Generally, an array of micro lenses is between the array of pixel sensors and the spacer plate. The micro lens array can be a conventional micro lens array or an array of gradient index micro lenses. With conventional micro lenses, the spacer plate can be attached to a standoff surrounding the arrays of pixel sensors and micro lenses. The standoff provides an air gap between the spacer plate and the micro lenses, and the height of the standoff and the thickness of the spacer plate together control the distance between the gradient index lenses and the respective sensor arrays. When an air gap is not required, the spacer plate can be directly attached to the array of micro lenses so that the spacer plate thickness controls the distance between the gradient index lenses and the respective sensor arrays.

Another embodiment of the invention is a process for fabricating camera modules. The process includes forming arrays of pixel sensors on a wafer, attaching a spacer plate to the wafer over the arrays of pixel sensors, forming far field lenses on the spacer plate, and cutting the wafer and spacer plate to separate the camera modules. Each far field lens, which can be a gradient index lens, corresponds to and overlies one of the arrays of pixel sensors and forms an image across the area of the corresponding array of pixel sensors.

Each camera module separated from the wafer includes one of the arrays of pixel sensors and the overlying far field lens.

Generally, the process also includes forming arrays of micro lenses, which can be conventional micro lenses or gradient index micro lenses. Each micro lens corresponds to one of the pixel sensors in the arrays of pixel sensors and focuses light onto the corresponding pixel sensor. The spacer plate can be attached directly to the micro lenses or to standoffs that surround respective arrays of micro lenses and provide a gap between the spacer plate and the micro lenses.

BRIEF DESCRIPTION OF THE DRAWINGS

Use of the same reference symbols in different figures indicates similar or identical items.

DETAILED DESCRIPTION

In accordance with an aspect of the invention, a camera module containing a CMOS image sensor array has a gradient index lens that can be fabricated at the wafer level during manufacture of the camera module. The gradient index lens is manufactured in place on the wafer and does not require mechanical attachment, alignment, or focusing processes. Additionally, the gradient index lens is compatible with high temperature assembly processes that integrate the camera module into an end product such as a portable telephone or a PDA.

Figure 1:
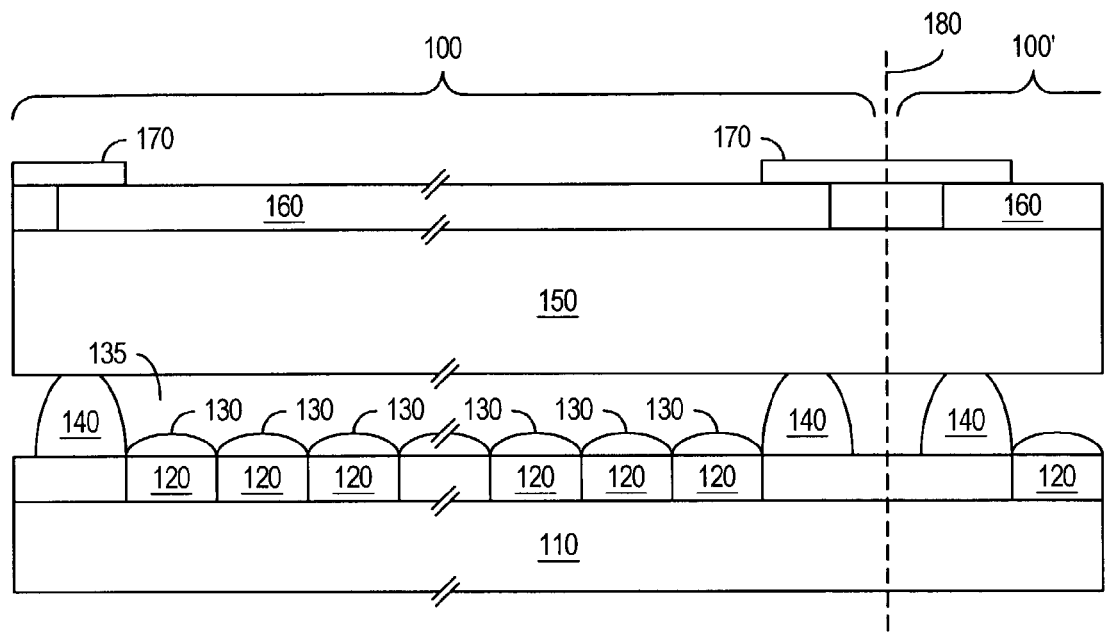
FIG. 1 shows a cross-sectional view of a portion of a wafer corresponding to camera modules in accordance with an embodiment of the invention employing convex micro lenses.

FIG. 1 shows a portion of a wafer 110 in and on which a camera module 100 is formed. Camera module 100 includes an array of pixel sensors 120, an array of micro lenses 130, a standoff 140 surrounding pixel sensors 120 and micro lenses 130, a spacer plate 150 attached to standoff 140 and overlying the pixel sensors 120 and micro lenses 130, a gradient index lens 160 on spacer plate 150, and a metallization layer or other opaque patterned layer 170 on gradient index lens 160.

The arrays of pixel sensors 120 and micro lenses 130 can be of any design, including the designs that are well known in the art. Each pixel sensor 120 includes a photosensitive region onto which a corresponding micro lens 130 focuses light. Additionally, each pixel sensor 120 may include a color filter that selects the color component (e.g., red, green, or blue) that the pixel sensor senses. The size and the number of pixel sensors 120 determine the image resolution, and a current pixel array would typically include hundreds or thousands of pixel sensors 120 per row or column. In an exemplary embodiment, each pixel sensor 120 or micro lens 130 has a width or diameter of about 4.9 µm. The size of the arrays depends on the resolution of the digital image being taken. For example, 352×288 arrays provide a CIF image, and a 640×480 arrays provide a VGA image.

One technique for forming an array of micro lenses 130 such as illustrated in FIG. 1 begins by coating wafer 110 with a layer of a transparent photoresist. The photoresist is then patterned to form small regions corresponding to micro lenses 130. After patterning, heating liquefies the photoresist, and the surface tension of the liquefied photoresist causes each region to take on a convex shape that remains when the photoresist solidifies. In one configuration, each pixel sensor 120 has a corresponding micro lens that overlies the pixel sensor 120 and focuses light onto the light sensitive area of the pixel sensor 120. Alternatively, a single cylindrical micro lens can extend across and focus light onto multiple pixel sensors 120, e.g., an entire row or column of pixel sensors 120 in the array.

Standoffs 140 are bumps on the surface of wafer 110 and serve to separate spacer plate 150 from micro lenses 130, thereby providing an air gap that micro lenses 130 require for proper focusing. Standoff 140 accordingly can be formed in a variety of ways and can have any shape and composition that provides the necessary gap and support for spacer plate 150. In one embodiment of the invention, standoff 140 is formed from the same material as micro lenses 130 but is higher than micro lenses 130 to provide the gap. Alternatively, additional material can be added in the area of standoff 140 or substrate 110 can be etched in the areas of pixel arrays 120 before the formation of the arrays of micro lenses 130. U.S. Pat. App. Ser. No. 10/184,154, entitled "Glass Attachment Over Micro Lens Arrays" further describes suitable standoff structures and processes for fabricating standoffs 140.

Spacer plate 150, which attaches to standoff 140, can be made of a material such as glass or plastic and has a thickness (e.g., 1 to 4 mm) selected according to the optical properties such as the focal length of gradient index lens 160 and any other optical elements of the camera module. Spacer plate 150 serves as a protective cover for the CMOS sensor arrays and can include optical coatings, for example, to provide an IR or color filter. Spacer plate 150 can include multiple layers or structures to achieve the desired thickness or optical characteristics.

Gradient index lens 160 is made of any material suitable for formation of a gradient index lens. One gradient index manufacturing process uses a sol-gel material that is a suspension of glass particles in a volatile material, and exposure during a grayscale photolithography process selectively removes some of the volatile material to change the refractive index of the sol-gel material. The refractive index variations give gradient index lens 160 its desired optical properties. Optically, gradient index lens 160 is a far-field lens that has an image plane at or near the plane of micro lenses 130. For a typical camera module in which the width of the array of pixel sensors 120 is currently between about 1.5 and 3.5 mm, gradient index lens 160 has a focal length through spacer plate 150 and gap 135 of about 3 to 4 mm.

Patterned layer 170 can be a metal or other light-blocking layer that is deposited and patterned using conventional wafer processing techniques to define an aperture for camera module 100. Although FIG. 1 shows patterned layer 170 on material forming gradient index lenses 160, patterned layer 170 may alternatively be formed on the top or bottom surface of spacer plate 150.

In operation, gradient index lens 160 forms an image on the plane of micro lenses 130, and micro lenses 130 focus the light from an associated area of the image onto light sensitive areas of pixel sensors 120. Each pixel sensor 120 measures the intensity of light incident on the associated area, and generates an electrical signal indicating the magnitude of the measured light intensity. For color imaging, color filters typically transmit different colored light to different pixel sensors, so that each pixel sensor measures the intensity of a corresponding component color such as red, green, or blue. Associated circuitry (not shown) for image signal processing or output may be formed on wafer 110 and connected to pixel sensors 120.

As shown in FIG. 1, camera module 100, including gradient index lens 160, can be fabricated at the wafer level with many other camera modules 100' being formed on the same wafer 110. After fabrication of gradient index lenses 160 and patterned layer 170, a conventional wafer scribing or cutting process along scribe lanes 180 separates wafer 110 into individual camera modules 100 and 100'

Where spacer plate 150 overlies electrical contacts or features of wafer 110 that must be accessible, notches can be precut in the underside of spacer plate 150 before spacer plate 150 is attached to wafer 110. After attachment of spacer plate 150 to wafer 100, a cutting process that cuts from the top surface of spacer plate 150 down to the precut notches (not shown) on the bottom surface can remove portions of spacer plate 150 overlying circuit elements. The notches provide a tolerance that permits cutting spacer plate 150 without damaging underlying structures of wafer 110.

Figure 2:
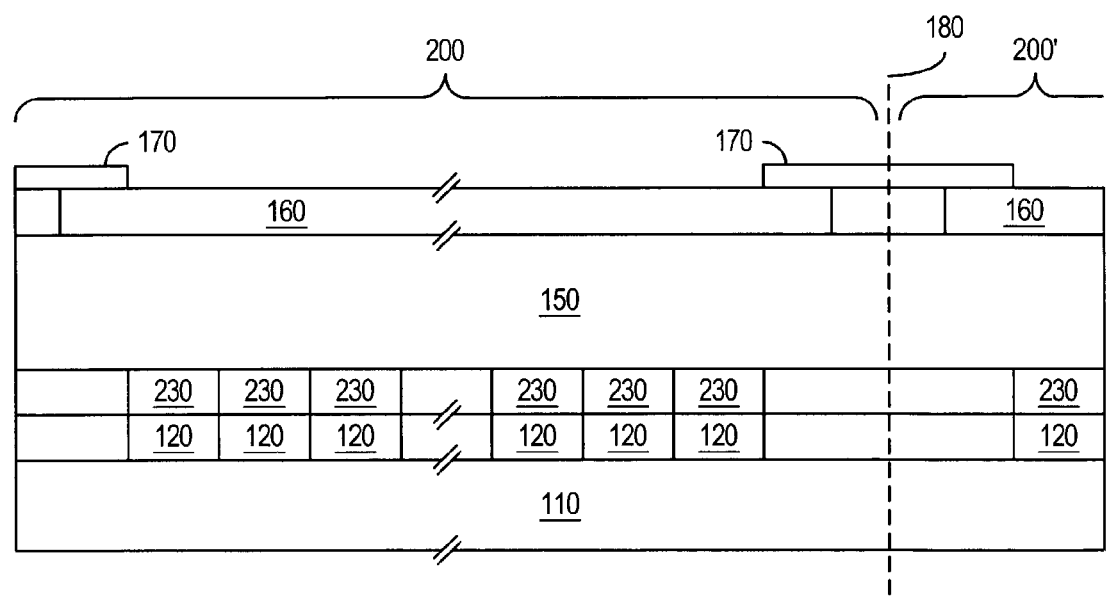
FIG. 2 shows a cross-sectional view of a portion of a wafer corresponding to camera modules in accordance with an embodiment of the invention employing gradient index micro lenses.

FIG. 2 illustrates a camera module 200 in accordance with an alternative embodiment of the invention. Camera module 200 is similar to camera module 100 and contains elements such as wafer 110, pixel sensors 120, spacer plate 150, gradient index lens 160, and patterned layer 170 that are described above in reference to camera module 100 of FIG. 1. Camera module 200 differs from camera module 100 in that gradient index micro lenses 230 in camera module 200 replace micro lenses 130 of camera module 100. Gradient index micro lenses 230 have a substantially flat surface on which spacer plate 150 can be directly attached without the need of standoff 140 to provide an air gap. Gradient index micro lens 230 can be formed using conventional techniques.

Figure 3:
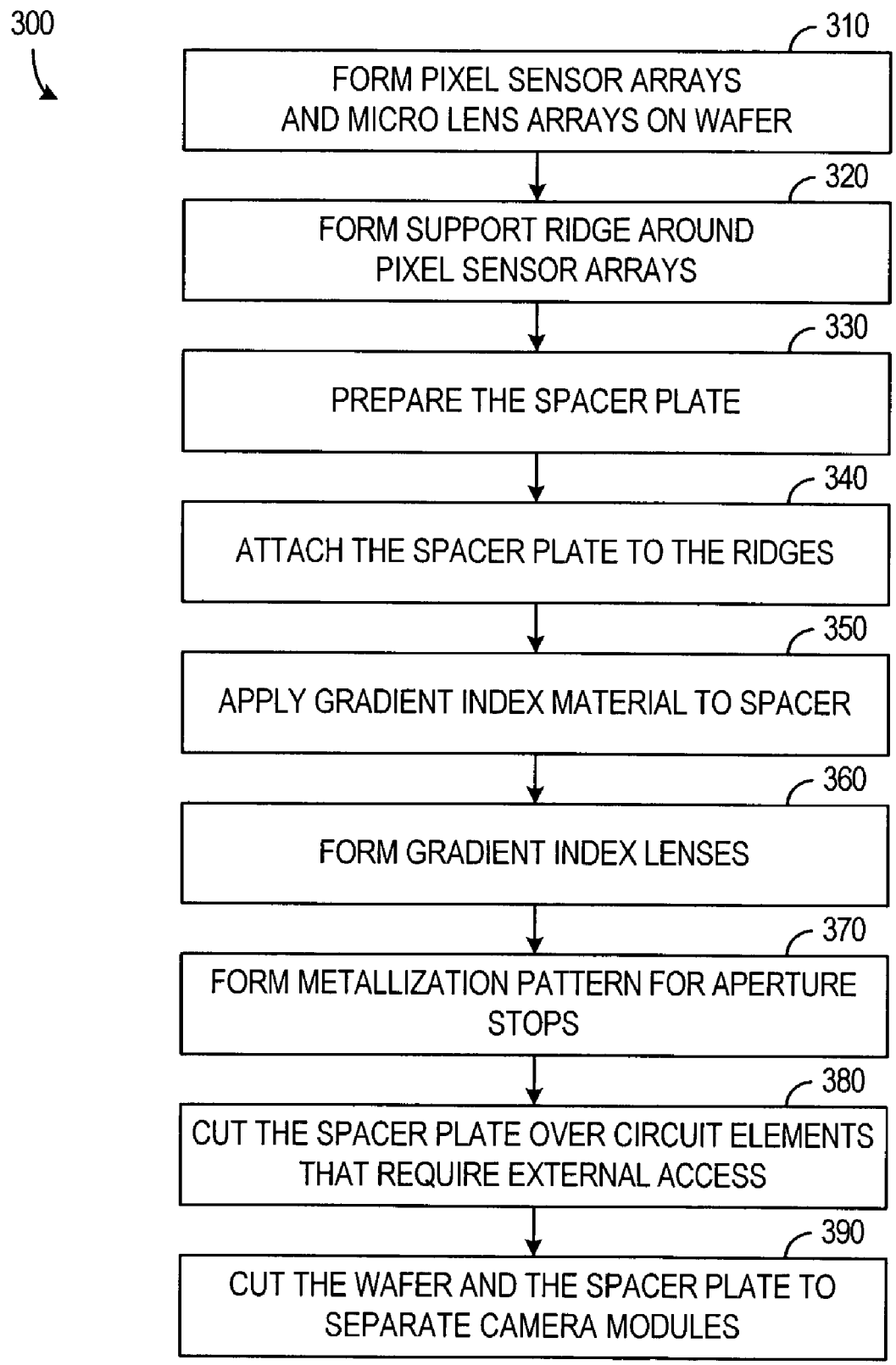
FIG. 3 is a flow diagram of a fabrication process in accordance with an embodiment of the invention.

FIG. 3 is a flow diagram of a process 300 for manufacturing camera modules in accordance with an embodiment of the invention. Process 300 begins with a step 310 of fabricating pixel sensor arrays and micro lens arrays on a semiconductor wafer. Conventional fabrication processes known for forming CMOS pixel sensors and micro lenses can be used, although as noted above in some embodiments of the invention the surface of the wafer may be etched or otherwise shaped before fabrication of pixel sensors 120 to provide standoffs 140 around the areas of the pixel sensor arrays. Alternatively or additionally, standoffs 140 can be extended, begun, or completed during the process of forming micro lenses 130.

In embodiments having standoffs 140, an optional step 320 forms or extends standoffs 140 to the desired height. In particular, standoffs 140 can be formed using thick photoresist layer that is patterned in a manner that leaves micro lenses 130 intact. Alternatively, standoffs 140 can be formed of any desired material that is deposited and patterned before formation of micro lenses 130.

Step 330 is preparation of spacer plate 150. In one embodiment, spacer plate 150 is a plate of optical quality glass or plastic having a thickness that provides the desired spacing between far-field lens 160 and micro lenses 130 or 230. Notches or grooves can be cut on the underside of spacer plate 150 to provide a gap having a depth (e.g., about 50 μm or more) that permits cutting of spacer plate 150 without damaging underlying circuit elements in wafer 110. Coatings can be formed on the bottom or top surface spacer plate 150 to provide spacer plate 150 with the desired optical properties. Such coatings include but are not limited to anti-reflection coatings, infrared (IR) filters, and color filters.

An attachment process 340 attaches spacer plate 150 to wafer 110. A single spacer plate 150 can cover all sensor arrays on wafer 110. Alternatively, multiple spacer plates 150 can cover the sensor arrays but leave electrical contacts accessible. When a spacer plate 150 covers electrical contacts or other elements that need to be accessible, the prepared notches or grooves in spacer plate 150 permit cutting of spacer plate 150 without damaging the underlying structure.

One attachment process 340 applies an adhesive such as NOA 68 made by Norland Products, Inc. or another UV or UV-visible curable adhesive to the top of standoffs 140. The adhesive may include filler particles of a size that maintains a desired adhesive thickness when spacer plate 140 is pressed onto standoffs 140. Processes such as those known for bonding layers of LCD panels can be used to selectively apply the adhesive to standoffs 140, place spacer plate 150 on standoffs 140, and cure the adhesive. If all the desired coatings were not formed during spacer plate preparation step 330, such coatings can be formed on the top surface of spacer plate 150 after attaching spacer plate 150 to wafer 110.

After attachment and optionally coating of spacer plate 150, step 350 applies a layer of material such as a sol-gel material to spacer plate 150, and step 360 forms the gradient index lenses 160, e.g., using a grayscale photolithography process. A processing step 370 then deposits and patterns a metallization or other light blocking material using conventional semiconductor manufacturing techniques to define apertures or stops for the gradient index lenses 160.

Steps 380 and 390 are cutting processes. In particular, step 380 cuts spacer plate 150 as required to expose portions of wafer 110 without damaging wafer 110. Step 390 cuts spacer plate 150 and wafer 110 to separate the individual camera module. The individual camera modules can be packaged using conventional structures such as lead frames with wire bonding for electrical connections, but the camera modules already have far-field lenses 160 aligned during the wafer fabrication process.

Each camera module thus produced does not require mechanical assembly of an additional lens. However, additional mechanically assembled optical components can be added to improve the optical performance or capabilities of a camera module. Even when additional optical elements are mechanically assembled, the manufacturing processes described here still provide cost, size, and reliability advantages because fewer mechanically assembled elements are required.

Although the invention has been described with reference to particular embodiments, the description is only an example of the invention's application and should not be taken as a limitation. For example, although the above embodiments employ a single chip scale gradient index lens per camera module for far-field imaging, additional optical elements may be fabricated at the wafer or chip level by adding spacer plates/coatings and gradient index lenses overlying the structures described above. Various other adaptations and combinations of features of the embodiments disclosed are within the scope of the invention as defined by the following claims.

What is claimed is:

1. A process for fabricating camera modules, comprising:
   forming a plurality of arrays of pixel sensors on a wafer;
   attaching a spacer plate to the wafer over the arrays of pixel sensors;
   forming a plurality of lenses on the spacer plate, wherein each lens corresponds to and overlies one of the arrays of pixel sensors and forms an image across an area of the corresponding array of pixel sensors; and
   splitting the wafer to separate camera modules, each camera module including one of the arrays of pixel sensors and one of the lenses,
   wherein the step of forming the plurality of lenses on the spacer plate is performed after the step of attaching the spacer plate to the wafer, and further including:

forming a plurality of arrays of micro lenses, wherein the micro lenses focus light onto corresponding pixel sensors:
    wherein forming the arrays of micro lenses comprises forming arrays of gradient index micro lenses in a lens layer having an upper surface that is substantially flat, the upper surface of the lens layer is an upper surface of the micro lenses, and attachina the spacer plate includes attaching the spacer plate directly to the upper surface of the micro lenses.

2. The process of claim 1, wherein each of the lenses comprises a gradient index lens.

3. The process of claim 1, wherein attaching the spacer plate comprises attaching the spacer plate to the arrays of micro lenses.

4. The method of claim 1, wherein attaching the spacer plate comprises directly attaching the spacer plate to the upper surface of the lens layer.

5. The process of claim 1, further comprising forming notches in the spacer plate before attaching the spacer plate to the wafer, wherein the lenses are formed on a side of the spacer plate opposite to the notches.

6. The process of claim 5, further comprising separating portions of the spacer plate along the notches after forming the lenses.

7. The process of claim 6, wherein separating the portions of the spacer plate comprises cutting the spacer plate down to the notches.

8. The process of claim 6, wherein the wafer comprises electrical contacts that underlie the notches and are exposed when the portions of the spacer plate are separated.

9. The method of claim 1, further comprising forming a patterned layer that defines apertures of the camera modules.

10. The method of claim 9, wherein the patterned layer overlies the lenses.

11. The process of claim 1, wherein attaching the spacer plate includes facing a first surface of the spacer plate toward the arrays of pixel sensors, and
    forming the plurality of lenses includes forming the lenses on a second surface of the spacer plate that is disposed opposite the first surface, and the second surface is further away than the first surface from the arrays of pixel sensors.

* * * * *

UNITED STATES PATENT AND TRADEMARK OFFICE
CERTIFICATE OF CORRECTION

PATENT NO. : 7,414,661 B2  
APPLICATION NO. : 10/260186  
DATED : August 19, 2008  
INVENTOR(S) : Hartlove et al.

Page 1 of 1

It is certified that error appears in the above-identified patent and that said Letters Patent is hereby corrected as shown below:

In column 7, line 3, in claim 1, delete ":" and insert -- ; --, therefor.

In column 7, line 8, in claim 1, delete "attachina" and insert -- attaching --, therefor.

Signed and Sealed this

Fourth Day of November, 2008

JON W. DUDAS  
*Director of the United States Patent and Trademark Office*